(12) United States Patent
Pedersen et al.

(10) Patent No.: US 11,122,360 B2
(45) Date of Patent: Sep. 14, 2021

(54) MICROPHONE ASSEMBLY WITH BACK VOLUME VENT

(71) Applicant: Knowles Electronics, LLC, Itasca, IL (US)

(72) Inventors: Michael Pedersen, Itasca, IL (US); Peter V. Loeppert, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/778,061

(22) Filed: Jan. 31, 2020

(65) Prior Publication Data
US 2020/0252716 A1   Aug. 6, 2020

Related U.S. Application Data

(60) Provisional application No. 62/800,240, filed on Feb. 1, 2019.

(51) Int. Cl.
*H04R 1/28* (2006.01)
*H04R 1/04* (2006.01)
(Continued)

(52) U.S. Cl.
CPC ......... *H04R 1/2846* (2013.01); *B81B 3/0027* (2013.01); *B81C 1/00158* (2013.01);
(Continued)

(58) Field of Classification Search
CPC .......... H04R 1/2846; H04R 1/04; H04R 1/08; H04R 1/222; H04R 1/283; H04R 31/00;
(Continued)

(56) References Cited

U.S. PATENT DOCUMENTS

| 7,190,038 B2 | 3/2007 | Dehe et al. |
| 7,473,572 B2 | 1/2009 | Dehe et al. |

(Continued)

FOREIGN PATENT DOCUMENTS

| CN | 106412781 A | 2/2017 |
| GB | 2 563 461 A | 12/2018 |
| WO | WO-2017/027242 A1 | 2/2017 |

OTHER PUBLICATIONS

Lim et al.,Translation of CN106412781A "Use of microphone subassembly boundary belt", Feb. 15, 2017.*

(Continued)

*Primary Examiner* — Regina N Holder
(74) *Attorney, Agent, or Firm* — Foley & Lardner LLP

(57) ABSTRACT

The problem of contaminants entering a microphone assembly through a pressure equalization aperture is mitigated by moving the pressure equalization aperture from a location near the acoustic port to a location on the cover of the microphone assembly. This is achieved by fabricating an aperture reduction structure using a separate dedicated die, with an aperture of diameter ~25 microns or less disposed on the aperture reduction structure, and then coupling the aperture reduction structure to the cover of the microphone. The relatively smaller aperture on the cover after the coupling of the aperture reduction structure is used for pressure equalization of the back volume of the microphone with a pressure outside of the microphone assembly.

25 Claims, 10 Drawing Sheets

(51) Int. Cl.
  *B81B 3/00* (2006.01)
  *B81C 1/00* (2006.01)
  *H04R 1/08* (2006.01)
  *H04R 1/22* (2006.01)
  *H04R 31/00* (2006.01)

(52) U.S. Cl.
  CPC .......... *H04R 1/04* (2013.01); *H04R 1/08* (2013.01); *H04R 1/222* (2013.01); *H04R 1/283* (2013.01); *H04R 31/00* (2013.01); *B81B 2201/0257* (2013.01); *B81B 2203/0127* (2013.01); *H04R 2201/003* (2013.01)

(58) Field of Classification Search
  CPC .......... H04R 2201/003; B81C 1/00158; B81B 2201/0257; B81B 2203/0127; B81B 3/0027
  See application file for complete search history.

(56) References Cited

U.S. PATENT DOCUMENTS

| | | | |
|---|---|---|---|
| 7,781,249 | B2 | 8/2010 | Laming et al. |
| 7,795,695 | B2 | 9/2010 | Weigold et al. |
| 7,825,484 | B2 | 11/2010 | Martin et al. |
| 7,829,961 | B2 | 11/2010 | Hsiao |
| 7,856,804 | B2 | 12/2010 | Laming et al. |
| 7,903,831 | B2 | 3/2011 | Song |
| 2005/0207605 | A1 | 9/2005 | Dehe et al. |
| 2007/0278501 | A1 | 12/2007 | MacPherson et al. |
| 2008/0175425 | A1 | 7/2008 | Roberts et al. |
| 2008/0267431 | A1 | 10/2008 | Leidl et al. |
| 2008/0279407 | A1 | 11/2008 | Pahl |
| 2008/0283942 | A1 | 11/2008 | Huang et al. |
| 2009/0001553 | A1 | 1/2009 | Pahl et al. |
| 2009/0180655 | A1 | 7/2009 | Tien et al. |
| 2010/0046780 | A1 | 2/2010 | Song |
| 2010/0052082 | A1 | 3/2010 | Lee et al. |
| 2010/0128914 | A1 | 5/2010 | Khenkin |
| 2010/0183181 | A1 | 7/2010 | Wang |
| 2010/0246877 | A1 | 9/2010 | Wang et al. |
| 2010/0290644 | A1 | 11/2010 | Wu et al. |
| 2010/0322443 | A1 | 12/2010 | Wu et al. |
| 2010/0322451 | A1 | 12/2010 | Wu et al. |
| 2011/0013787 | A1 | 1/2011 | Chang |
| 2011/0075875 | A1 | 3/2011 | Wu et al. |
| 2014/0264650 | A1 | 9/2014 | Liu et al. |

OTHER PUBLICATIONS

International Search Report and Written Opinion, PCT/US2020/016012, Knowles Electronics, LLC (dated May 19, 2020).

\* cited by examiner

US 11,122,360 B2

MICROPHONE ASSEMBLY WITH BACK VOLUME VENT

CROSS-REFERENCE TO RELATED APPLICATION

This application claims the benefit of and priority to U.S. Provisional Patent Application No. 62/800,240, filed Feb. 1, 2019, which is incorporated herein by reference in its entirety.

TECHNICAL FIELD

The present disclosure relates generally to systems and methods for providing an aperture or vent into the back volume of a microphone assembly.

BACKGROUND

It is desirable for microphone assemblies to be ingress resistant against contamination. Contamination may consist of particles, liquids, or vapors which can condense in the microphone assembly. These contaminants might cause performance shifts or temporary or even permanent failures of the device. Contaminants may enter the microphone assembly during initial manufacturing, during attachment of the microphone to the PCB of an electronic device such as a cell phone, or during use.

SUMMARY

In some embodiments, a microphone assembly includes a substrate with a port formed therein. The microphone assembly includes an acoustic transducer coupled to the substrate, disposed over the port and separating a front volume from a back volume of the microphone, with the front volume being in fluidic communication with the port. The microphone assembly also includes a cover comprising a first aperture. The microphone assembly further includes an aperture reduction structure comprising a second aperture and coupled to the cover overlapping the first aperture, wherein the second aperture is smaller than the first aperture.

In some embodiments, a microphone assembly includes a substrate with a port formed therein. The microphone assembly includes an acoustic transducer coupled to the substrate that is pierce-less, disposed over the port and separating a front volume from a back volume of the microphone, with the front volume being in fluidic communication with the port. The microphone assembly also includes a cover comprising a first aperture. The microphone assembly further includes an aperture reduction structure comprising a second aperture and coupled to the cover overlapping the first aperture, wherein the second aperture is smaller than the first aperture and the second aperture provides an only path to equalize pressure between that of the back volume of the microphone assembly and a pressure outside of the microphone assembly.

In some embodiments, a method of forming a microphone assembly includes providing a substrate having a port formed therein. The method includes coupling an acoustic transducer to a first surface of the substrate, the acoustic transducer being disposed over the port. The method further includes coupling a cover to the first surface of the substrate, the cover comprising a first aperture, the microphone assembly comprising a back volume between the acoustic transducer and the cover. The method includes removing contaminants from the back volume through the first aperture during coupling of the cover to the first surface of the substrate. The method also includes coupling an aperture reduction structure to the cover at a position overlapping the first aperture after removing the contaminants, the aperture reduction structure comprising a second aperture smaller than the first aperture.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

Figure 1:
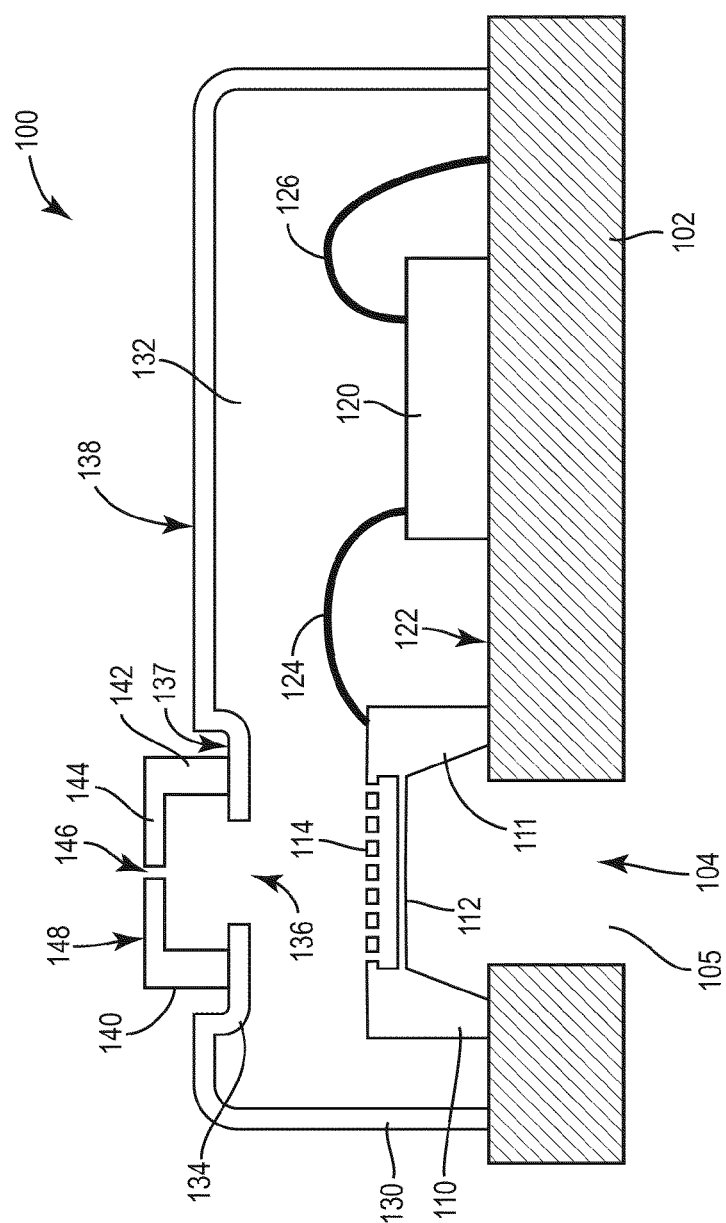
FIG. 1 depicts an embodiment in which an aperture reduction structure is coupled to the cover of a microphone to provide back volume venting for pressure equalization.

In the following detailed description, various embodiments are described with reference to the appended drawings. The skilled person will understand that the accompanying drawings are schematic and simplified for clarity and therefore merely show details which are essential to the understanding of the disclosure, while other details have been left out. Like reference numerals refer to like elements or components throughout. Like elements or components will therefore not necessarily be described in detail with respect to each figure.

DETAILED DESCRIPTION

Most microphones have at least one diaphragm that moves in response to a pressure differential on either side of it. One side of the diaphragm is exposed to what is called the front volume which is in communication with an acoustic port where the pressure consists of atmospheric pressure plus the acoustic pressure of a sound field. The other side of the diaphragm is exposed to the back volume where the pressure is just the atmospheric pressure. Thus the diaphragm moves in response to the acoustic pressure of the sound field. The pressure in the back volume is maintained by a small aperture to the outside of the microphone so it may follow any atmospheric pressure changes, for instance from changing altitude or weather related events. This process is called pressure equalization of the back volume with a pressure outside of the microphone assembly, since the atmospheric pressure is balanced in both the front and back volumes in the absence of acoustic pressure of a sound field entering the microphone's front volume through the acoustic port. The atmospheric pressure changes occur at relatively low rates. It is undesirable to allow acoustic pressure changes to enter the back volume for this would lead to cancelation of part of the acoustic signal entering the front volume. For this reason, the size of the pressure equalization aperture may be determined, in conjunction with the size of the back volume, to create a low pass filter with a cut-off frequency of a few tens of Hertz, so that acoustic pressure changes above the cut-off frequency of the low pass filter are blocked from entering the back volume of the microphone.

Microelectromechanical systems ("MEMS") microphones include a MEMS transducer that has typically included a pressure equalization aperture through the diaphragm because the aperture size can be tightly controlled through the MEMS process and this leads to consistent performance. MEMS capacitive transducers are particularly sensitive to contamination since they include a highly perforated, fixed back plate in close proximity (a few microns) to the diaphragm. It is the motion of the diaphragm in response to acoustic pressure, relative to the back plate that creates the electrical signal that replicates the acoustic signal. Any contamination that blocks the perforations in the back plate or gets between the diaphragm and back plate and in any way restricts the diaphragm motion will affect microphone performance. However, during manufacturing, volatile compounds (i.e., contaminants) may be driven off which may condense on the MEMS transducer structure. This is of particular concern while soldering the microphone cover onto the PCB substrate to complete the protective housing of the microphone assembly. During the soldering operation, the absolute temperature of the assembly is about doubled and the solder flux is vaporized. The increase in pressure, caused by the high temperature, drives the solder flux vapor through the MEMS transducer and out through the pressure equalization aperture in the diaphragm. Some of this solder flux may condense on the MEMS transducer causing potential long term reliability issues. The same issue may occur in reverse when the finished microphone is soldered into the end-use electronic device (i.e., a host device), for example a cell phone. Solder flux that is vaporized, may pass through the pressure equalization aperture, and condense on the MEMS transducer. Furthermore, a person using a cell phone, for instance, will be talking close enough that water vapor from the person's breath may enter the microphone through the pressure equalization aperture and condense on the MEMS transducer. The phone might even be dropped into a liquid (e.g., water) causing some liquid contaminants to enter the microphone assembly. This disclosure relates to apparatus and methods for forming pressure equalization apertures that reduce or minimize the chance of contaminants entering the microphone assembly and affecting the reliability of the microphone.

Embodiments described herein relate generally to systems and methods for providing a small aperture (i.e., an opening or a vent path) in the cover of a microphone assembly to provide pressure equalization between a back volume of a microphone assembly and the pressure external to the microphone assembly. Various embodiments described herein address the problem of ingress through the acoustic port and/or transducer of a microphone by moving the pressure equalization aperture to the cover of the microphone. By providing the aperture in the cover, the outside environment with which the pressure is equalized may be an internal volume of a host device. As such, in some such embodiments, the contaminants incident on the equalization aperture from the outside environment may be less than implementations in which an equalization aperture is provided in the substrate or transducer proximate the acoustic port.

To ensure proper acoustic performance, the pressure equalization aperture should be sufficiently small. In some implementations, the aperture in the cover must be small enough to ensure a low frequency roll-off (LFRO) of the acoustic signal to be of the order of a few tens of Hertz. If the aperture is large, the LFRO will be correspondingly higher. This will result in some portion of the lower range of the acoustic frequencies of the incoming sound waves entering the back volume of the microphone, in addition to entering the front volume. Thus, the low frequency part of the desired acoustic response of the microphone will be cancelled. It is the diameter of the aperture and the length of the aperture through the cover material that determines its acoustic resistance. It is this resistance in conjunction with the size of the back volume that determines the low frequency roll-off threshold. In some implementations, it may be desirable to allow transmission of only atmospheric pressure frequencies through the pressure equalization aperture and block the transmission of most or all acoustic frequencies. In some such implementations, it may be desirable to block fluid communication of pressure signals having frequencies of greater than a threshold level, such as 10 Hz. In some designs with small back volumes, the desire to block frequencies greater than a threshold frequency level may call for an aperture no greater than a threshold diameter, such as 25 microns. However, it is difficult to machine or even laser drill a small hole with a diameter of the order of 25 microns in the types of materials typically used in microphone assembly covers, such as metals (e.g., aluminum, brass, copper, stainless steel, etc.). Typical applications in cell phones require the LFRO tolerance to be +/−10% and that translates to an aperture diameter tolerance of about +/−5%.

It can be difficult to manufacture a cover having a pressure equalization aperture that is sufficiently small to produce a strong acoustic performance. The present disclosure provides various example implementations that address this difficulty by utilizing a cover with a larger aperture formed therein and an aperture reduction structure coupled to the cover and having a smaller aperture formed therein to reduce the size of the equalization aperture through the cover. The aperture reduction structure is coupled to the cover in a manner such that it overlaps the larger hole formed in the cover. The aperture reduction structure has the smaller hole formed therein, such that the effective hole through the cover is reduced to the smaller aperture size of the aperture reduction structure. In some embodiments, the aperture reduction structure may be formed of a material, such as silicon, in which a small aperture (e.g., less than 25 microns in diameter) is more easily fabricated than a material of the cover. Therefore, in various embodiments, the techniques of the present disclosure may provide a less expensive and/or more reliable and consistent way of forming a sufficiently small pressure equalization aperture through a cover.

In some embodiments, the microphone may have no pressure equalization aperture in the transducer or the substrate proximate the acoustic port. This can substantially improve the ingress resistance of the microphone, as the port is typically facing an outside environment of a host device in which the microphone assembly is mounted. In such embodiments, the microphone has no aperture or pathway through which contaminants and/or water or other liquids may enter the microphone through the port. In some such implementations, the present features may help the microphone assembly achieve a higher water ingress rating.

Additionally, some embodiments may be manufactured in a manner that allows for contaminants in the microphone formed during the manufacturing process to be removed prior to final assembly. The cover may be attached to the substrate, such as via a solder reflow process, and contaminants (e.g., vapors) may remain in a back volume of the microphone. In some embodiments, the contaminants may be removed through the relatively large aperture in the cover and then the aperture reduction structure may be coupled to the cover to reduce the size of the equalization aperture. In this manner, the contaminants may be removed from the microphone without requiring complex methods for removing the contaminants through a small aperture. This may help reduce microphone failures and performance issues due to contaminants during manufacturing.

FIG. 1 is a side cross-section view of a MEMS microphone 100, according to some embodiments. The MEMS microphone 100 may be used for converting acoustic signals into electrical signals in any device such as, for example, cell phones, laptops, television remotes, tablets, audio systems, head phones, wearables, portable speakers, car sound systems or any other device which uses a microphone assembly.

The MEMS microphone 100 includes a substrate 102, an acoustic transducer 110, an integrated circuit 120, a cover 130, and an aperture reduction structure 140. The substrate 102 can be formed from materials used in printed circuit board (PCB) fabrication (e.g., plastics). For example, the substrate may include a PCB structured to mount the acoustic transducer 110, the integrated circuit 120 and the cover 130 thereon. A port 104 is formed in the substrate 102. The acoustic transducer 110 is coupled to a first surface 122 of the substrate 102, and is positioned over the port 104. The acoustic transducer 110 separates a front volume 105 from a back volume 132 of the microphone assembly, the front volume 105 being in fluidic communication with the port 104. The integrated circuit 120 is electrically coupled to the acoustic transducer 110, for example, via a first electrical lead 124 and also to the substrate 102 (e.g., to a trace or other electrical contact disposed on the substrate 102) via a second electrical lead 126. The integrated circuit 120 receives an electrical signal from the acoustic transducer 110 and may amplify or condition the signal before outputting a digital or analog electrical signal replicating the acoustic signal. In some embodiments, the integrated circuit 120 may be a mixed-signal CMOS semiconductor device. The cover 130 has a first aperture 136 formed therein. The aperture reduction structure 140 includes an aperture reduction support member 142 and an aperture reduction layer 144, with the aperture reduction layer 144 including a second aperture 146 (the components of the aperture reduction structure are best seen in FIG. 5D, at the end of an example process of the fabrication of an aperture reduction structure). In various embodiments, the aperture reduction support member 142 and the aperture reduction layer 144 may be made from the same material or from different materials. The second aperture 146 is smaller than the first aperture 136 and when the aperture reduction structure is coupled to the cover with the second aperture 146 overlapping the first aperture 136, then the effective size of the aperture formed in the cover is that of the smaller second aperture 146.

The MEMS capacitive acoustic transducer 110 is configured to generate an electrical signal in response to acoustic disturbances incident on the transducer 110. The transducer 110 includes a transducer substrate 111, a back plate 114, and a diaphragm 112. The port 104 is configured to carry (e.g., transmit, etc.) sound energy to at least one of the diaphragm 112 and the back plate 114. The diaphragm 112 is made of a conductive material, such as polysilicon, and is attached to the transducer substrate 111 and disposed over the port 104. The diaphragm 112 is configured to vibrate in response to acoustic pressure. The back plate 114 is attached to the transducer substrate 111 with an intervening sacrificial layer to space it from the diaphragm 112. The back plate 114 is comprised of a dielectric material, such as silicon nitride in some embodiments. A plurality of perforations (not shown) in the back plate 114 allow air, otherwise trapped between the diaphragm 112 and the back plate 114, to escape. The back plate 114 is stiff and thus relatively stationary compared to the diaphragm.

In the embodiment of FIG. 1, the acoustic transducer 110 may be a capacitive transducer and may include a diaphragm 112 and a back plate 114. In some implementations, the acoustic transducer 110 may include a MEMS transducer embodied as a condenser-type transducer having a diaphragm 112 movable relative to a back plate in response to changes in acoustic pressure. Alternatively, the MEMS acoustic transducer 110 may include a piezoelectric device, or some other known or future electro-acoustic transduction device implemented using MEMS technology. In still other implementations, the acoustic transducer 110 is a non-MEMS device embodied, for example, as an electret or other known or future non-MEMS type transduction device. In some embodiments, the diaphragm 112 may be configured to vibrate in response to an acoustic signal (e.g., sound). In such embodiments, vibration of the diaphragm 112 because of the acoustic signal may generate an electrical signal (e.g., a voltage corresponding to a change in capacitance thereof), which may be measured and is representative of the acoustic signal. In some implementations, vibration of the membrane relative to a back plate (e.g., a fixed back plate) causes changes in the capacitance between the diaphragm 112 and the back plate and corresponding changes in the generated electrical signal. In other embodiments, the acoustic transducer 110 may be formed from a piezoelectric material, for example, quartz, lead titanate, III-V and II-VI semi-conductors (e.g., gallium nitride, indium nitride, aluminum nitride, zinc oxide, etc.), graphene, ultra nanocrystalline diamond, polymers (e.g., polyvinylidene fluoride) or any other suitable piezoelectric material. In such embodiments, vibration of the acoustic transducer 110 in response to the acoustic signal may generate an electrical signal (e.g., a piezoelectric current or voltage) which is representative of the acoustic signal. These acoustic transducer devices are known generally and are not described further except to the extent necessary to make and use the embodiments disclosed herein.

It should be appreciated that while some diaphragms used in microphone assemblies include a hole or pierce for pressure equalization, in the illustrated embodiment shown in FIG. 1, the diaphragm 112 of the acoustic transducer 110 is pierce-less and does not include such a hole or pierce. The MEMS microphone 100 may have improved ingress resistance as compared to similar microphone assemblies utilizing a transducer pierce. Capacitive transducers are particularly sensitive to contamination that gets between the diaphragm and the back plate and restricts the diaphragm movement. In the illustrated embodiment, the only open path for contaminants to get into the back volume, and thus to reach the MEMS acoustic transducer, is through the cover, which is exposed only to an internal volume of the host device, rather than being exposed to an external environment of the host device through the port 104. Replacing the pierce through the transducer with an aperture through the cover eliminates one major source of transducer contamination.

In the embodiment of FIG. 1, the cover 130 is coupled to a first surface 122 of the substrate 102. The cover 130 defines the back volume 132 within which the integrated circuit 120 and the acoustic transducer 110 are positioned. For example, as shown in FIG. 1, the cover 130 is positioned on the substrate 102 such that the substrate 102 forms a base of the MEMS microphone 100, and the substrate 102 and the cover 130 together form a housing of the MEMS microphone 100 and cooperatively define the back volume 132.

The cover 130 may be formed from a suitable material such as, for example, metals (e.g., aluminum, brass, copper, stainless steel, etc.), plastics, polymers, etc., and may be coupled to the substrate 102, for example, via an adhesive, solder, or fusion bonded thereto. In a particular embodiment, the cover 130 may be formed from a metal such as copper, brass, aluminum, etc. and soldered to the substrate 102. The embodiment depicts a reverse coined area 134 defined on the cover, wherein a portion of the cover to which the aperture reduction structure is coupled is indented inwards towards the substrate. In the embodiment of FIG. 1, a first aperture 136 is defined in the reverse coined area 134 of the cover 130, although in other embodiments, the first aperture 136 may be defined on the cover 130 without a reverse coined area. In some implementations, a reverse coined area or coined area may be implemented using the techniques and features described in U.S. Pat. No. 9,883,270, titled "Microphone with Coined Area", filed May 13, 2016, the entire contents of which are incorporated herein by reference.

In the embodiment of FIG. 1, an aperture reduction structure 140 having a second aperture 146 is coupled to a top surface 137 of a portion of the cover 130. In some embodiments, such as described in details below, the aperture reduction structure 140 may be coupled to the cover during a late stage in the fabrication process of the MEMS microphone 100, such as after solder reflow. During solder reflow of the cover, before the aperture reduction structure is added, volatile contaminants including solder flux can exit the housing through the first aperture 136 on the cover 130, without passing through the MEMS structure. The second aperture 146 is smaller than the first aperture 136. In some implementations, the second aperture 146 on the aperture reduction structure 140 is substantially aligned with the first aperture 136 of the cover 130. By positioning the aperture reduction structure 140 within a reverse coined area 134, an overall height of the microphone 100 may be reduced, which may allow for the microphone 100 to be positioned within a smaller cavity in a host device. It is the size of the second aperture 146 in conjunction with the size of the back volume 132 that sets the low frequency roll-off (LFRO) threshold of the microphone. For microphone assemblies with back volumes on the order of a few cubic millimeters, the diameter of the second aperture 146 will be on the order of 10-25 microns for a LFRO threshold of 30 Hz. One skilled in the art can easily calculate the particular diameter of the second aperture given a particular microphone assembly implementation and LFRO requirement.

In some embodiments, the aperture reduction structure 140 may be made of silicon, glass, high-temperature plastic, sheet metal or plated metal. The embodiment of FIG. 1 depicts a silicon die structure which is coupled to the cover 130 using a conventional die bonding process. Many conventional die bonding materials, such as epoxies and silicones, cure with only water vapor or carbon dioxide being given off. These materials are not a particular contamination threat to the MEMS structure. The second aperture 146 still offers a path for these curing effluents (i.e., contaminants) to leave the assembly.

Figure 2:
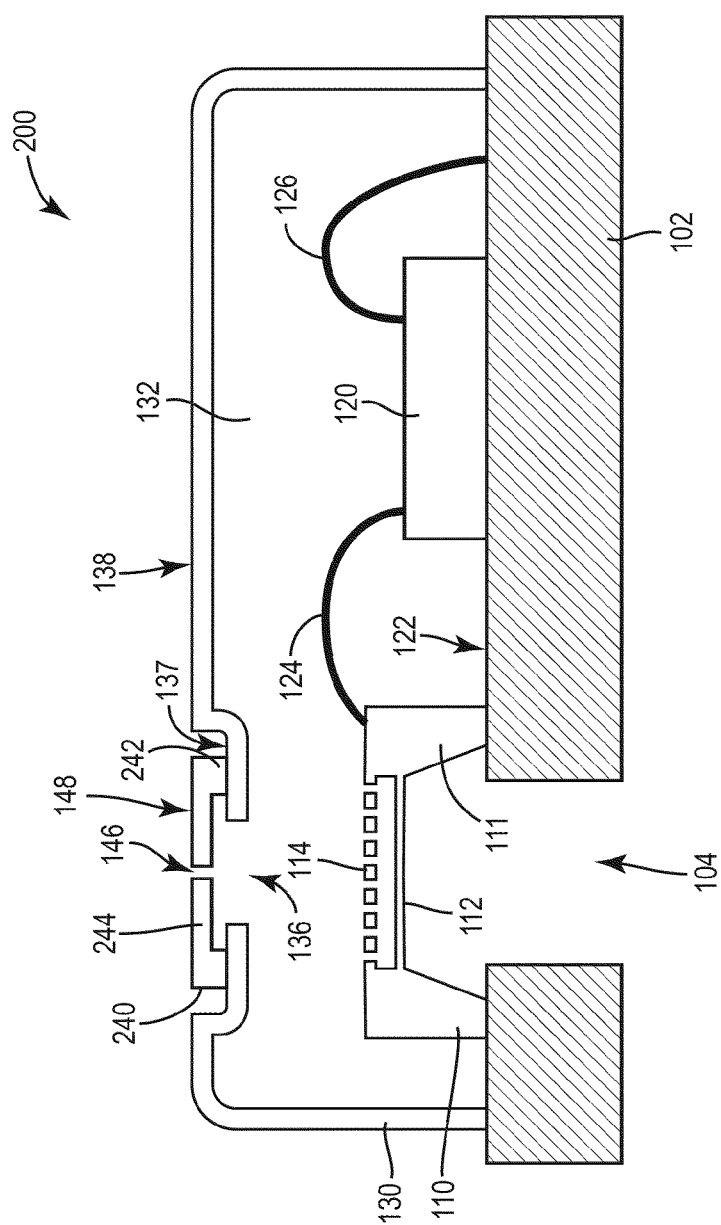
FIG. 2 illustrates an embodiment in which the top surface of the aperture reduction structure is coplanar with the top surface of the microphone cover.

FIG. 2 is an embodiment where the aperture reduction support member 242 of the aperture reduction structure 240 is reduced in height compared to the height of the aperture reduction support member 142 depicted in the embodiment of FIG. 1, thus allowing the top surface 148 of the aperture reduction layer 244 to be substantially coplanar with the surface 138 of the cover 130 farthest from the substrate 102. This permits easier handling of the microphone during automated assembly processes (pick and place) and further reduces the microphone height to meet strict size constraints required in many consumer electronic devices. While FIG. 2 illustrates an embodiment in which the aperture reduction support member 242 is reduced in height to make the top surface 148 of the aperture reduction structure to be substantially coplanar with the surface 138 of the cover 130 farthest from the substrate 102, in other embodiments, the aperture reduction support member 242 may be further reduced in height to make the height of the aperture reduction structure 240 fall below that of the surface 138 of the cover 130 farthest from the substrate 102.

Figure 3:
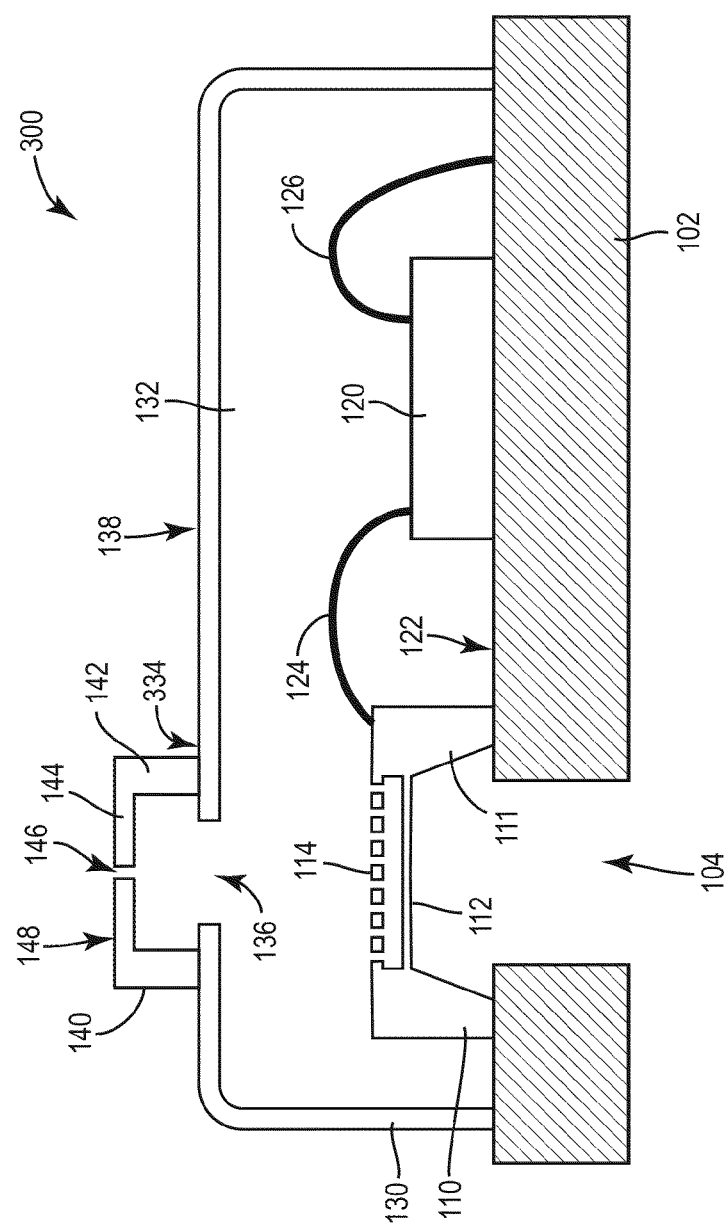
FIG. 3 is an embodiment where the coupling of the aperture reduction structure occurs on a flat area of the cover.

FIG. 3 is an embodiment where the cover 130 does not include a reverse coined area, but instead is substantially flat 334 across the surface 138 of the cover 130 farthest from the substrate 102. The aperture reduction structure 140 including the second aperture 146 is coupled to the surface 138 of the cover farthest from the substrate 102, substantially aligned with the first aperture 136 on the cover 130. This embodiment eliminates the reverse coined area formed in the microphone cover, thus simplifying the fabrication of the cover.

Figure 4:
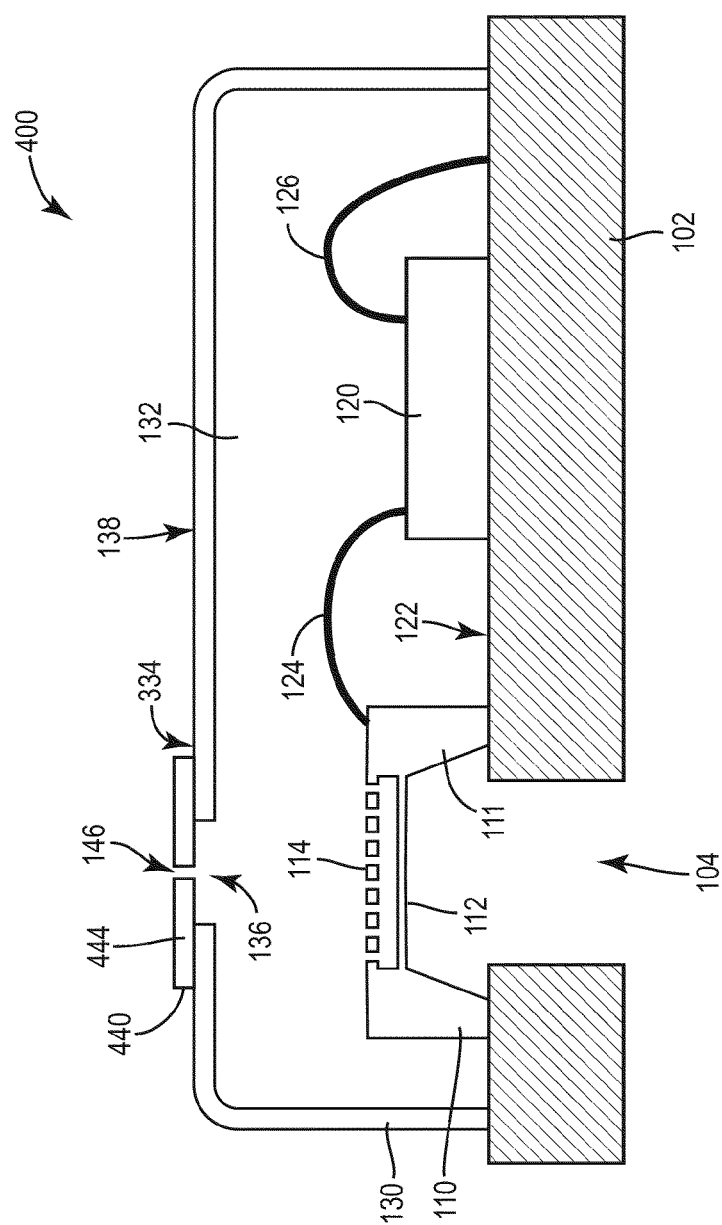
FIG. 4 illustrates an embodiment where the aperture reduction structure includes only a flat aperture reduction layer.

FIG. 4 is an embodiment in which the aperture reduction support member of the aperture reduction structure 440 has been substantially ground down, or reduced such that the aperture reduction structure 440 is formed of only the flat aperture reduction layer 444. The aperture reduction layer 444 includes the second aperture 146. This embodiment may further reduce the height of the microphone assembly and also does not include the reversed coined area, thus enabling integration of the microphone with host devices with very strict requirements on the height of the microphone assembly and providing for less complex manufacturing of the cover 130. It should be understood that the substantially flat aperture reduction layer 444 could also be used with embodiments having a reversed coined area.

FIG. 5A-5D depict an example method of fabrication of the aperture reduction structure 500, according to an embodiment.

Figure 5A:
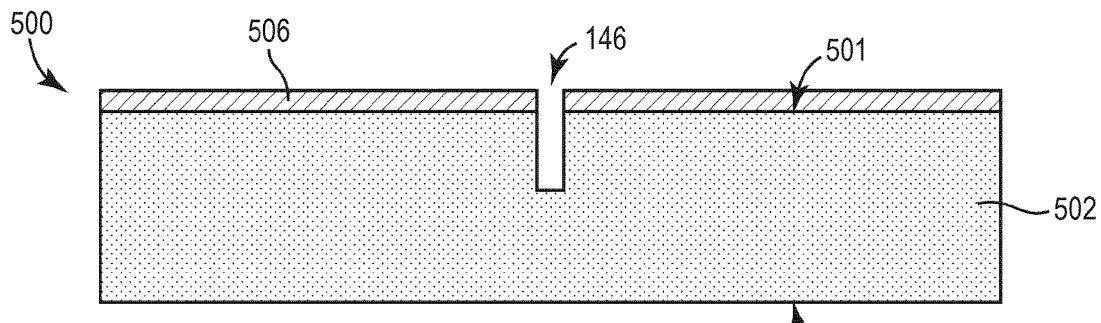
FIG. 5A-5D depicts a method of fabrication of the aperture reduction structure.

In FIG. 5A, an aperture 146 is etched on the top surface 501 of a silicon die substrate 502, using an etch mask 506.

Figure 5B:
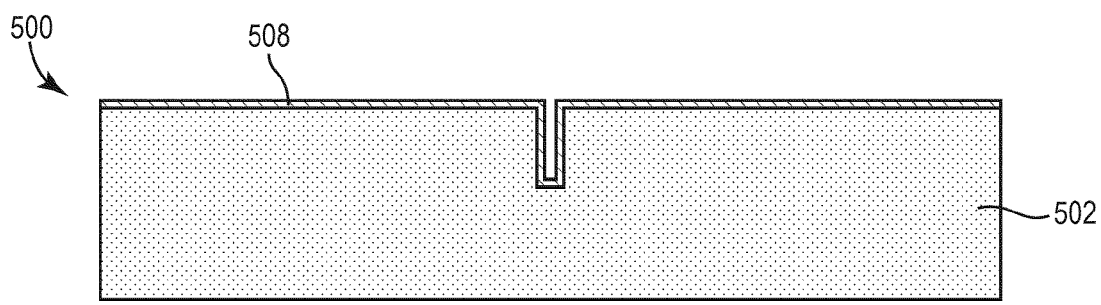

In FIG. 5B, a sacrificial or masking layer 508 is deposited on top of the aperture 146 to protect it during subsequent backside processing.

Figure 5C:
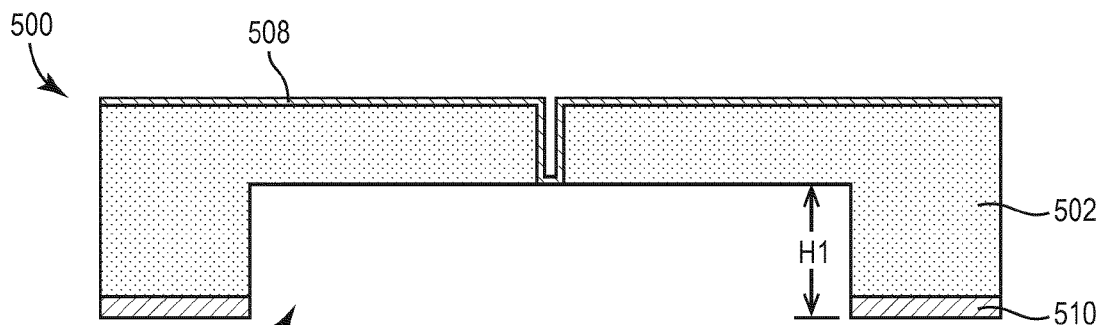
Figure 5D:
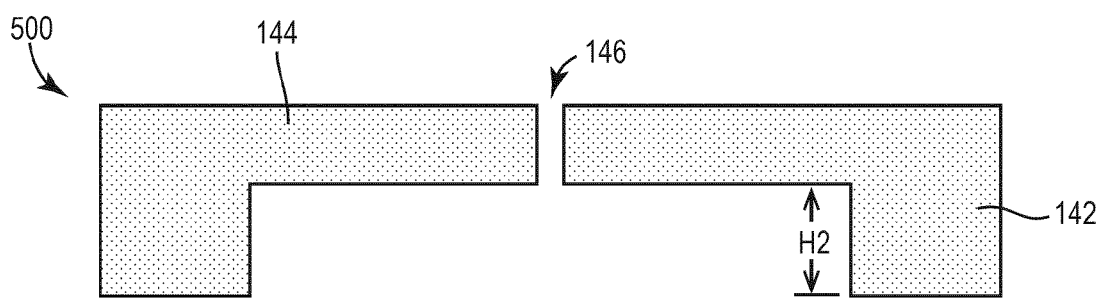

In FIG. 5C, a cavity 512 is etched on the bottom surface 503 of the silicon die substrate 502 using an etch mask 510. The cavity 512 is etched until it reaches at least the masking layer 508, with a height of the cavity of H1, as shown in FIG. 5C.

In FIG. 5D, the sacrificial or masking layer 508 is removed, the etch mask 510 is removed and back grinding of the silicon die 502 is performed to reduce it to its final height H2 (<100 um). The removal of the masking layer 508 in FIG. 5D exposes the aperture 146. As depicted in the embodiment of FIG. 5D, the aperture reduction layer 144 is the portion of the substrate 502 that remains surrounding the aperture 146, whereas the support structures on the two sides of the substrate 502 after the cavity has been formed are termed as the aperture reduction support member 142. The thickness of the aperture reduction layer 144 and the diameter of the second aperture 146 set its acoustic resistance which in turn participates with the back volume in setting the LFRO threshold of the microphone. The fabrication process depicted in FIG. 5A-5D allow the flexibility to adjust the height H2 of the aperture reduction support member 142 during back grinding to fabricate the aperture reduction structures of the embodiments of FIG. 1, FIG. 2, and FIG. 3, as desired.

Figure 6A:
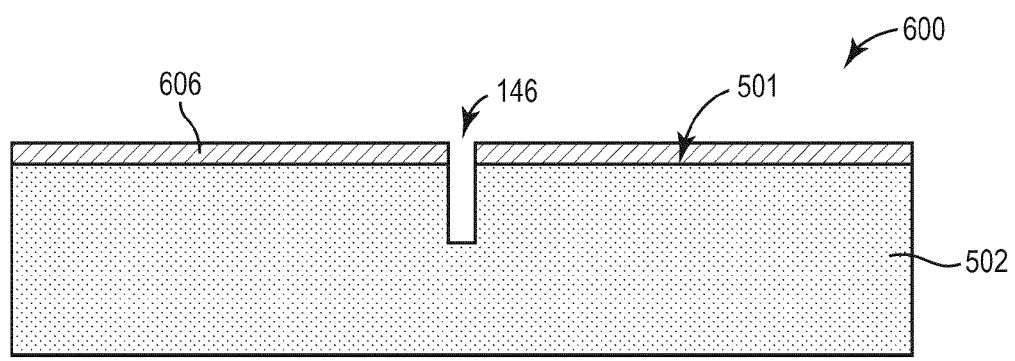
FIG. 6A-6B depicts an alternate method of fabrication of the aperture reduction structure.
Figure 6B:
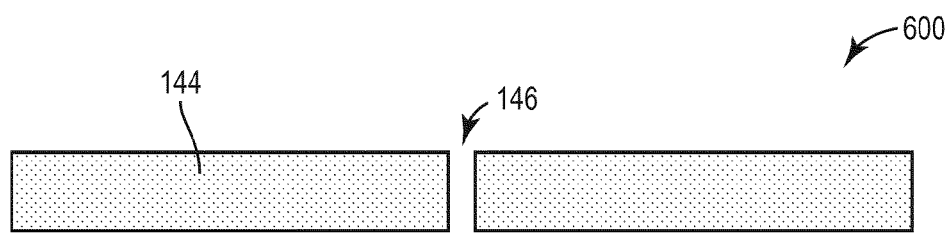

FIG. 6A-6B depict an alternate method of fabrication of the aperture reduction structure according to another embodiment. In FIG. 6A, an aperture 146 is etched on the top surface 501 of a silicon die substrate 502, using an etch mask 606. In FIG. 6B, back grinding of the silicon die substrate 502 is performed to expose the aperture 146, and the back grinding is continued until only a thin aperture reduction layer 144 with the aperture 146 disposed on it is left behind. Masking layer 606 may or may not be removed as it plays little role in the final structure. This simplified fabrication process may be used to fabricate the aperture reduction structure of the embodiment depicted in FIG. 4. Once again, the thickness of the aperture reduction layer 144 and the diameter of the second aperture 146 set its acoustic resistance which in conjunction with the back volume determines the LFRO threshold of the microphone. While this structure can be made quite thin, the tradeoff is increased fragility. The aperture reduction structure depicted in FIG. 5D may have less fragility than the aperture reduction structure of FIG. 6B due to the strengthening nature of the aperture reduction support member 142 surrounding the thin aperture reduction layer 144.

Figure 7:
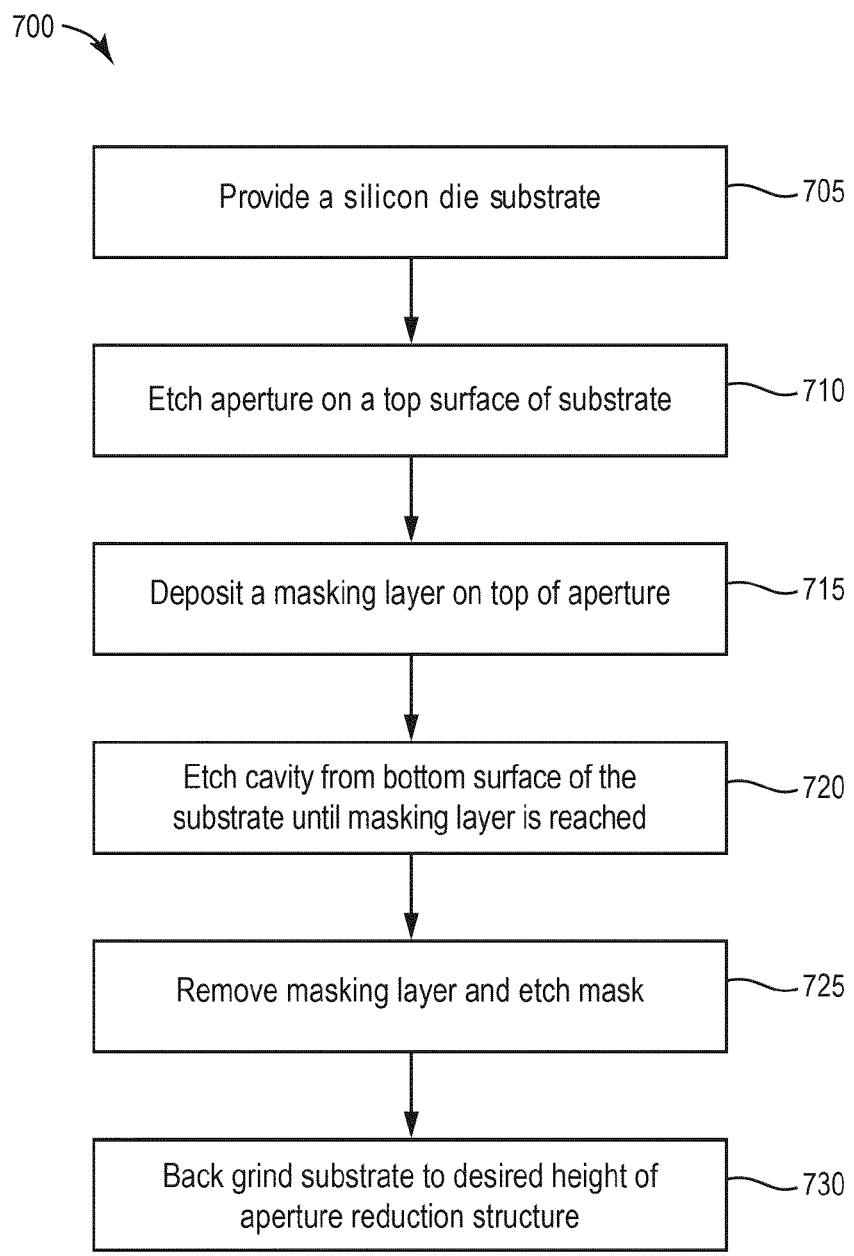
FIG. 7 illustrates a method of fabricating the aperture reduction structure.

FIG. 7 is a flowchart depicting a method 700 of fabrication of an aperture reduction structure, according to an exemplary embodiment. Method 700 may be used to implement the fabrication process shown in FIGS. 5A-5D, in some embodiments. At step 705, a silicon die substrate is provided on which the aperture reduction structure will be formed. At step 710, an aperture is etched on the top surface of the silicon die substrate, using an etch mask. At step 715, a sacrificial or masking layer is deposited on top of the aperture to protect it during subsequent backside processing. At step 720, a cavity is etched on the bottom surface of the silicon die substrate using an etch mask. The cavity is etched until it reaches at least the masking layer. At step 725, the sacrificial or masking layer is removed, and the etch mask is removed. At step 730, back grinding of the silicon die substrate is performed to reduce the aperture reduction structure to its final height, with both the aperture reduction support member and aperture reduction layer being exposed.

Figure 8:
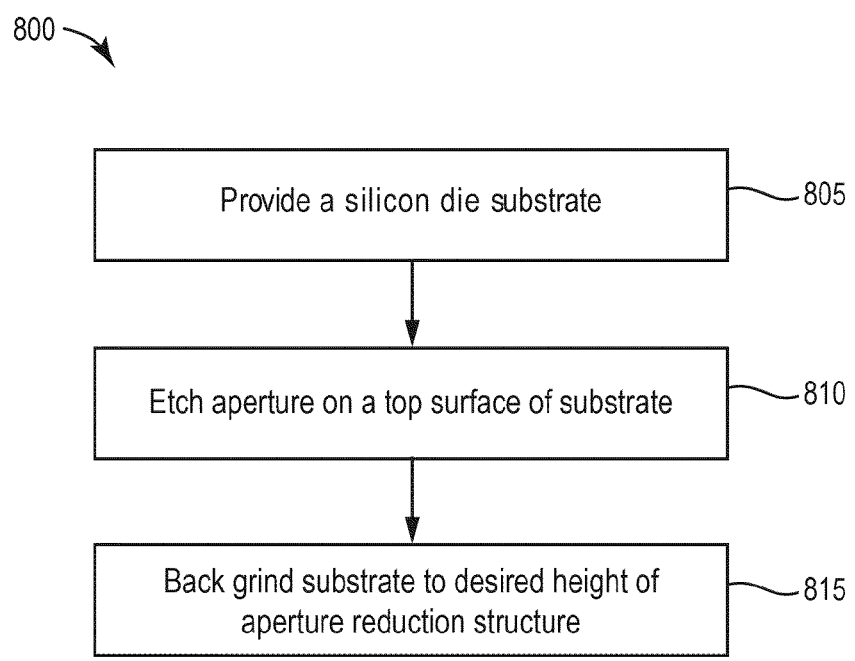
FIG. 8 illustrates an alternate method of fabricating the aperture reduction structure.

FIG. 8 is a flowchart depicting an alternate method 800 of fabrication of an aperture reduction structure, according to an exemplary embodiment. Method 800 may be used to implement the fabrication process shown in FIGS. 6A and 6B, in some embodiments. At step 805, a silicon die substrate is provided on which the aperture reduction structure will be formed. At step 810, an aperture is etched on the top surface of the silicon die substrate, using an etch mask. At step 815, back grinding of the silicon die substrate is continued until only a thin aperture reduction layer with the aperture disposed on it is left behind.

Figure 9:
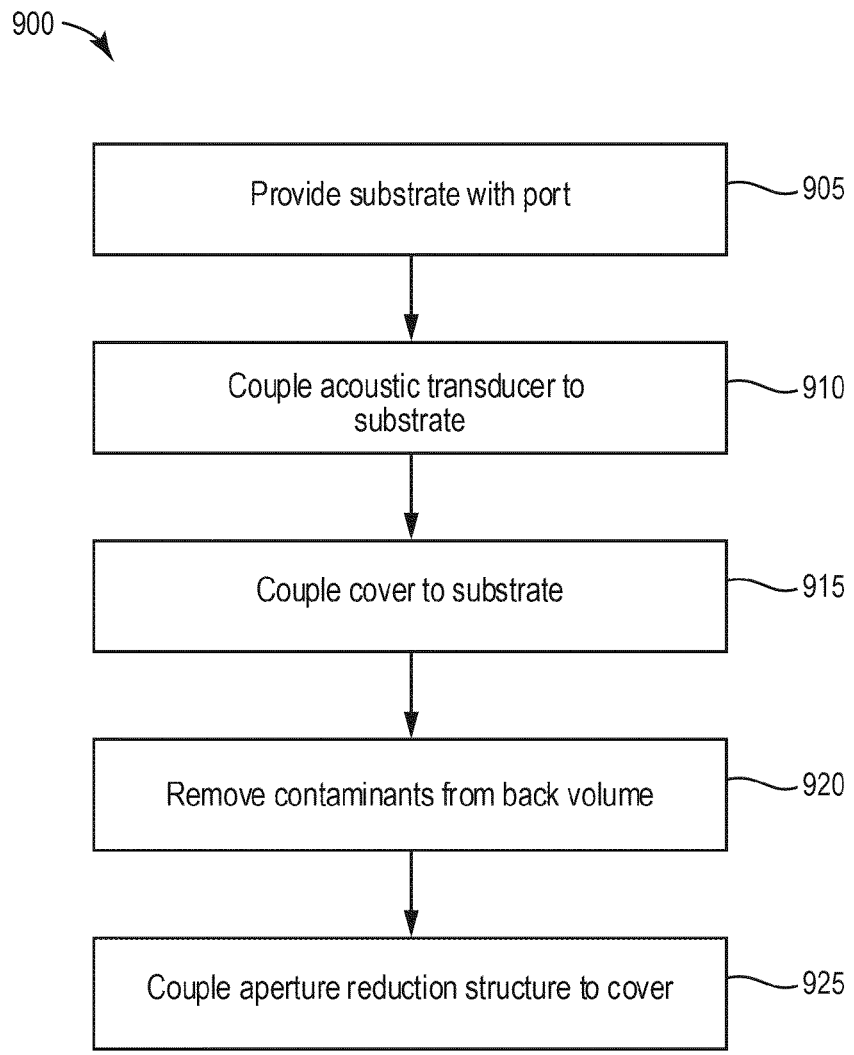
FIG. 9 illustrates a method of fabricating the microphone assembly.

FIG. 9 is a flowchart depicting a method of fabrication of a microphone assembly 900, according to an exemplary embodiment. At step 905, a substrate is provided with a port formed in the substrate to allow acoustic communication through the port to an interior portion of the microphone. At step 910, an acoustic transducer is coupled to a first surface of the substrate, with the acoustic transducer being disposed over the port. At step 915, a cover is coupled to the first surface of the substrate. The cover and substrate together form a housing to protect the acoustic transducer, and the cover includes a first aperture.

In some implementations, the cover may be coupled to the substrate using a solder reflow process. Solder reflow is a method of attaching surface mount components to printed circuit boards (or substrate) to form acceptable solder joints by first pre-heating the components, PCB, or solder paste and then melting the solder without causing damage by overheating. This process may lead to release of contaminants in the form of solder or flux vapor. At step 920, contaminants are removed from back volume by allowing solder or flux vapor to escape through the first aperture. The relatively large first aperture on the cover allows most solder or flux vapor to escape without forcing the vapors to go through the MEMS transducer, which advantageously may result in less contamination in the MEMS transducer. If the MEMS transducer contains a pressure equalization pierce, the majority (approximately in proportion to the relative sizes of the first aperture and the transducer pierce) of the solder or flux vapor will exit through the much larger first aperture. At step 925, an aperture reduction structure is coupled to the cover overlapping the first aperture. The aperture reduction structure includes a second aperture that is smaller than the first aperture. By first removing contaminants and then coupling the aperture reduction structure to the cover, the contaminants can be safely and effectively removed while still allowing for the cover to have a sufficiently small pressure equalization opening to fulfill the desired acoustic characteristics of the microphone assembly. The coupling of the aperture reduction structure to the top surface of the cover can take place at a late stage of the microphone fabrication process, after solder reflow and potentially before device singulation, in some implementations. Alternately, singulation can take place before the attachment of the aperture reduction structure, the latter being performed on individual microphones or while the microphones are still aligned on a dicing frame.

Figure 10:
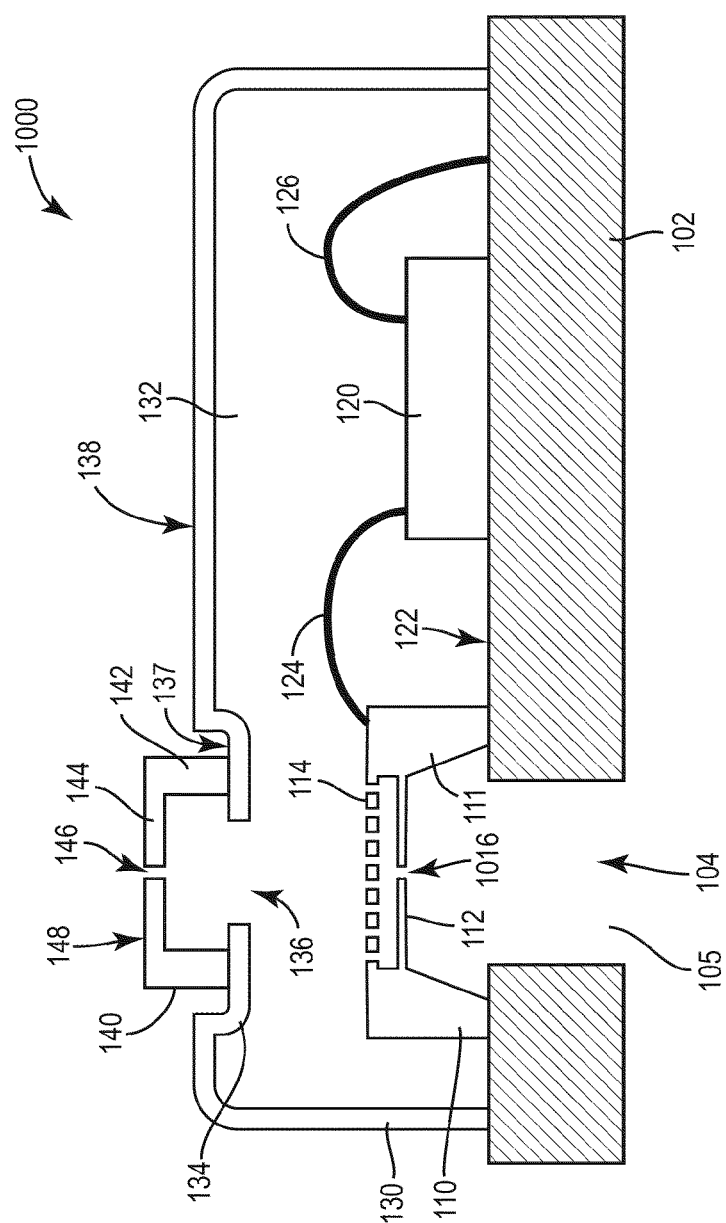
FIG. 10 depicts an embodiment in which an aperture reduction structure is used in conjunction with a small pierce in the diaphragm of the acoustic transducer to provide back volume venting for pressure equalization.

FIG. 10 is an embodiment in which there is a small pierce (or aperture) 1016 in the diaphragm of a MEMS acoustic transducer, unlike the pierce-less diaphragm in several other embodiments of the invention. The rest of the embodiment is similar to the embodiment depicted in FIG. 1. One skilled in the art may calculate the diameter of each of the apertures on the aperture reduction structure and the diaphragm of the MEMS acoustic transducer such that the total equalization diameter distributed over the two apertures allows for the desired LFRO threshold of the microphone (with the size of the back volume being another factor in the calculation). An advantage of the embodiment of FIG. 10 is that the total equalization diameter is distributed over the two apertures on the aperture reduction structure and the diaphragm of the MEMS acoustic transducer, which means that one or both of the apertures can be a lot less in diameter of what they would have been without the other aperture. In some cases, this might lead to an acceptable compromise in reducing the chance of contaminants entering the microphone assembly along with an improvement in the reliability of the microphone, just in case one of the apertures gets blocked temporarily.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly comprising:
   a substrate having a port formed therein;
   an acoustic transducer coupled to the substrate, disposed over the port, and separating a front volume from a back volume of the microphone assembly;
   a cover coupled to the substrate, comprising a first aperture; and
   an aperture reduction structure comprising a second aperture and coupled to the cover overlapping the first aperture, wherein the second aperture is smaller than the first aperture, and wherein the second aperture overlaps the first aperture.

2. The microphone assembly of claim 1, wherein the acoustic transducer is pierce-less.

3. The microphone assembly of claim 1, wherein diameter of the second aperture is less than or equal to 25 microns.

4. The microphone assembly of claim 1, wherein the aperture reduction structure comprises an aperture reduction support member and an aperture reduction layer, wherein the aperture reduction layer comprises the second aperture.

5. The microphone assembly of claim 1, wherein a portion of the cover is indented inwards towards the substrate.

6. The microphone assembly of claim 5, wherein the aperture reduction structure is coupled to a surface of the portion of the cover indented inwards towards the substrate.

7. The microphone assembly of claim 6, wherein the surface of the portion of the cover is exposed to an outside environment of the microphone assembly.

8. The microphone assembly of claim 6, wherein a surface of the aperture reduction structure is substantially coplanar with a surface of the cover.

9. The microphone assembly of claim 1, wherein the aperture reduction structure is a flat aperture reduction layer, wherein the aperture reduction layer comprises the second aperture and is directly coupled to the cover.

10. The microphone assembly of claim 9, wherein the aperture reduction structure is coupled to a surface of a portion of the cover indented inwards towards the substrate.

11. The microphone assembly of claim 1, wherein a ratio of a diameter of the first aperture to a diameter of the second aperture is in the range from 5 to 200.

12. The microphone assembly of claim 1, wherein the acoustic transducer comprises a pierce.

13. The microphone assembly of claim 1, wherein the aperture reduction structure comprises at least one of silicon, plastic, sheet metal, plated metal, or glass.

14. The microphone assembly of claim 1, wherein the acoustic transducer comprises a microelectromechanical systems (MEMS) acoustic transducer.

15. The microphone assembly of claim 14, wherein the microphone assembly further comprises an integrated circuit configured to generate an electrical signal indicative of acoustic activity sensed by the MEMS acoustic transducer.

16. A microphone assembly comprising:
a substrate having a port formed therein;
a MEMS acoustic transducer that is pierce-less coupled to the substrate, disposed over the port, the MEMS acoustic transducer comprising:
a back plate; and
a diaphragm structured to vibrate in response to pressure changes through the port, the back plate and diaphragm together forming a capacitor having a capacitance that changes responsive to movement of the diaphragm;
an integrated circuit coupled to the substrate configured to generate an electrical signal representative of acoustic activity based on changes in capacitance between the diaphragm and the back plate of the MEMS acoustic transducer;
a cover coupled to the substrate, comprising a first aperture; and
an aperture reduction structure comprising a second aperture and coupled to the cover overlapping the first aperture, wherein the second aperture is smaller than the first aperture, and wherein the second aperture overlaps the first aperture.

17. The microphone assembly of claim 16, wherein a portion of the cover is indented inwards towards the substrate.

18. The microphone assembly of claim 17, wherein the aperture reduction structure is coupled to a surface of the portion of the cover indented inwards towards the substrate.

19. The microphone assembly of claim 18, wherein a surface of the aperture reduction structure is substantially coplanar with a surface of the cover.

20. The microphone assembly of claim 16, wherein the aperture reduction structure is a flat aperture reduction layer, wherein the aperture reduction layer comprises the second aperture and is directly coupled to the cover.

21. The microphone assembly of claim 20, wherein the aperture reduction structure is coupled to a surface of a portion of the cover indented inwards towards the substrate.

22. A method of forming a microphone assembly, the method comprising:
providing a substrate having a port formed therein;
coupling an acoustic transducer to a first surface of the substrate, wherein the acoustic transducer is disposed over the port;
coupling a cover to the first surface of the substrate, the cover comprising a first aperture;
removing contaminants from the back volume through the first aperture during coupling of the cover to the first surface of the substrate; and
coupling an aperture reduction structure to the cover at a position overlapping the first aperture after removing the contaminants, the aperture reduction structure comprising a second aperture smaller than the first aperture, wherein the second aperture overlaps the first aperture.

23. The method of claim 22, the method further comprising coupling the aperture reduction structure to the cover after solder reflow.

24. The method of claim 22, further comprising forming the aperture reduction structure by:
providing a silicon substrate;
etching the second aperture in a first surface of the silicon substrate to form an aperture reduction layer; and
etching a second surface of the silicon substrate opposing the first surface to form a cavity under a portion of the aperture reduction layer comprising the second aperture.

25. The method of claim 22, further comprising forming the aperture reduction structure by:
providing a silicon substrate;
etching the second aperture in a first surface of the silicon substrate; and
removing material from a second surface of the silicon substrate opposing the first surface until a final height of the aperture reduction structure is reached.

* * * * *